United States Patent
Klingberg et al.

(10) Patent No.: US 7,065,330 B2
(45) Date of Patent: Jun. 20, 2006

(54) TRANSMITTER

(75) Inventors: Mats Klingberg, Enskede (SE); Scott Leyonhjelm, Sundbyberg (SE)

(73) Assignee: Telefonaktiebolaget LM Ericsson (PUBL), Stockholm (SE)

( * ) Notice: Subject to any disclaimer, the term of this patent is extended or adjusted under 35 U.S.C. 154(b) by 490 days.

(21) Appl. No.: 10/432,549

(22) PCT Filed: Nov. 7, 2001

(86) PCT No.: PCT/SE01/02440

§ 371 (c)(1),
(2), (4) Date: May 23, 2003

(87) PCT Pub. No.: WO02/43260

PCT Pub. Date: May 30, 2002

(65) Prior Publication Data

US 2004/0029542 A1    Feb. 12, 2004

(30) Foreign Application Priority Data

Nov. 24, 2000    (SE) .................................. 0004330

(51) Int. Cl.
*H04Q 11/12* (2006.01)
*H04B 1/00* (2006.01)

(52) U.S. Cl. ............... 455/126; 455/69; 455/67.11; 455/110; 455/522

(58) Field of Classification Search ............... 455/91, 455/110, 112, 113, 115.1, 118, 126, 127.1, 455/127.2, 522, 69, 63.1, 67.11; 375/295, 375/296, 297, 302; 332/117, 123
See application file for complete search history.

(56) References Cited

U.S. PATENT DOCUMENTS 4,700,151 A    10/1987    Nagata 5,507,017 A  *  4/1996    Whitmarsh et al. ......... 455/126
5,732,333 A  *  3/1998    Cox et al. .................... 455/126

(Continued)

FOREIGN PATENT DOCUMENTS

DE    199 52 249 A1    5/2000

OTHER PUBLICATIONS

MacEachern et al, "Novel Indirect-Conversion Transceiver Architectures Using Phantom Oscillators", 2000 IEEE Radio and Wireless Conference, Sep. 10-13, 2000, pp. 223-226.

(Continued)

*Primary Examiner*—Quochien B. Vuong
(74) *Attorney, Agent, or Firm*—Nixon & Vanderhye, P.C.

(57) ABSTRACT

A transmitter comprises a device (20) for frequency up-conversion of a communication signal having at least two consecutive frequency conversion stages, a power amplifier (27) for amplifying the output signal therefrom for obtaining a transmission signal and means (29) for extracting the transmission signal. It also has a device for frequency down-conversion of said extracted transmission signal to the same frequency as the communication signal before said up-conversion for creating a feedback signal. Said two devices use the same local oscillators (25, 26). The transmitter also has means for signal parameter adaptation of the communication signal on basis of the feedback signal for obtaining a desired character of the transmission signal. The frequency down-conversion device comprises a local oscillator combiner (30) producing a combined frequency signal used for frequency down-conversion of the transmission signal reducing the number of conversion stages in the path of the extracted transmission signal with respect to the corresponding number of the frequency up-conversion device.

41 Claims, 4 Drawing Sheets

U.S. PATENT DOCUMENTS

| | | | | |
|---|---|---|---|---|
| 5,752,171 | A | * | 5/1998 | Akiya ........................ 455/126 |
| 5,937,011 | A | | 8/1999 | Carney et al. |
| 5,974,302 | A | | 10/1999 | Adamiecki et al. |
| 6,029,052 | A | | 2/2000 | Isberg et al. |
| 6,072,364 | A | | 6/2000 | Jeckeln et al. |
| 6,591,090 | B1 | * | 7/2003 | Vuorio et al. ................. 455/91 |
| 6,677,870 | B1 | * | 1/2004 | Im et al. ...................... 375/297 |

OTHER PUBLICATIONS

Patent Abstract of Japan, JP55085147, Advantest Corp, Jun. 1980.

Patent Abstract of Japan, JP56117431, Matsushita Electric Ind Co Ltd, Sep. 1981.

Kamozaki et al, "A GaAs MMIC Chip Set for 1.9GHz Japanese Personal Handy Phone System", IEEE, Apr. 1995, pp. 311-315.

Steyaert et al, "TA 8.3 A2V CMOS Cellular Transceiver Front-End", Digest of Technical Papers, ISSCC 2000/Session 8/Wireless RX/TX, Paper TA 8.3, 2000, IEEE International Solid-State Circuits Conference, 2000, pp. 142-143.

Borremans et al, "A 1.5 V, Wide Band 3GHz, CMOS Quadrature Direct Up-Converter for Multi-Mode Wireless Communications", IEEE 1998 Custom Integrated Circuits Conference, 1998, pp. 79-82.

Grabowski et al, "An Experimental M-QAM Modem Using Amplifier Linearization and Baseband Equalization Techniques", CH 1824-2/82/0000-0405, IEEE, 1982, pp. E3.2.1-E3.2.6.

International Search Report mailed Mar. 1, 2002 in corresponding PCT application No. PCT/SE01/02440.

International Preliminary Examination Report mailed Oct. 15, 2002 in corresponding PCT application No. PCT/SE01/02440.

European Search Report mailed Aug. 30, 2001 in corresponding SE application No. 0004330.

* cited by examiner

TRANSMITTER

This application is the U.S. National phase of international application PCT/SE01/02440 filed 7 Nov. 2001 which designates the U.S.

THE BACKGROUND OF THE INVENTION AND PRIOR ART

The present invention relates to a transmitter according to the preamble of claim 1, a method for signal processing in a transmitter according to the preamble of claim 22, a computer program according to claim 39 and a computer readable medium according to claim 41.

"Transmitter" is here to be given a very broad sense and also covers so called transmitter configurations having for example a plurality of branches for said communication signal and/or means for transmitting the transmission signal, such as antennas, as for example an adaptive antenna. However, it is pointed out that the transmission medium does not necessarily have to be "the air", but it could be any conceivable medium, such as a cable. Furthermore, "communication signal" is defined as the signal including the information to be transmitted by the transmitter travelling to and past the power amplifier, and the "transmission signal" is defined as the signal at the output of said power amplifier transmitted by the transmitter and also extracted for creating the feedback signal and travelling in a feedback loop back to said means for signal parameter adaptation.

A transmitter of this type may find may preferred applications, among which as a transmitter for mobile base stations may be mentioned as a non-limitative example.

The general construction of such a transmitter according to the prior art is illustrated in the appended FIG. 1 and will now be briefly explained with reference made thereto. This transmitter has a signal source 1, which can be digital or analog, a frequency up-conversion device 2, a power amplifier 3 and an antenna 28 adapted to transmit the transmission signal resulting at the output of the power amplifier 3. The frequency up-conversion device has preferably at least two mixing stages each including a local oscillator 4, 5 and a frequency mixer 6, 7. Filters 8, 9 are arranged in the signal path downstream of each frequency mixer for rejecting unwanted spurii and only letting for instance the wanted sideband through. The respective filter requirements may be reduced if the frequency mixer in question is instead a single sideband mixer or quadrature modulator configuration having then two frequency mixers. The reason for using multiple stages in the frequency up-conversion device is to spread the filtering requirements between different mixing stages, such that the overall filtering requirements can be met. If instead only one mixing stage was used, the filter thereof would have to reject all unwanted spurii, some of them very close to the wanted signal. Such a filter is very hard to design, especially at high frequencies. With more than one mixing stage, the filtering requirements will be distributed and therefore be easier met, so that filters with high selectivity work at lower frequencies making the design thereof much easier.

For some transmitters high demands on certain properties of the transmission signal are put, and they therefore require a feedback observation signal from the output of the power amplifier for enabling adjustment of the communication signal for obtaining these properties of the transmission signal. The transmission signal is for this sake extracted at the output of the power amplifier 3 by an extracting means 10, which may be for example a coupler, but it may also be for example an antenna receiving the transmission signal transmitted by the antenna 28. A frequency down-conversion of this extracted transmission signal then takes place in a frequency down-conversion device 11 using the same local oscillators 4, 5 as the frequency up-conversion device 2 making the design coherent. A design having separate local oscillators for the frequency up- and down-conversion would also be coherent if the local oscillators were locked to the same time reference. This also means a lower cost, since the number of local oscillators is reduced. A feedback signal having the same frequency as the input signal to the frequency up-conversion device is in this way obtained, and this signal is then compared with a communication signal corresponding to a wanted transmission signal for signal parameter adaptation of the communication signal. The comparison has to be made in this low frequency region, but the adjustments of the communication signal may be carried out anywhere along the path thereof, such as in this low frequency region, or even between the frequency up-conversion device and the power amplifier or after the latter. A block 84 between the coupler 10 and antenna 28 is also shown. This block may have nothing in it, or it may have a duplexer if a receiver is to be attached to the same antenna, or it may have a circulator if it is desired to protect the integrity of the feedback down-conversion signal from external signals picked up by the antenna or a combination of the two.

Said comparison may be made continuously, but it is underlined that the signal parameter adaptation is only carried out as often as required when the condition changes for creating a transmission signal having the desired properties for these new conditions. In one possible application a predistortion of the communication signal, in the digital or in the analogous domain, is carried out for cancelling distortions of the signal generated in the communication signal path, such as in the power amplifier, for obtaining a substantially distortion-free transmission signal. These distortions may change with for example temperature and component ageing, so that an adaptation of the predistortion parameters therefore is needed. Another possible application is in a transmitter comprising an adaptive antenna, in which said comparison is utilized to influence the communication signal for meeting gain and/or phase requirements of the transmission signals from different antennas thereof. Such a transmitter comprises a plurality of branches each including a frequency up-conversion device, power amplifier and an antenna, but the invention also covers the case of such a multiple branch configuration in which all the branches have one up-converter in common, or one up-converter and one power amplifier in common.

Figure 1:
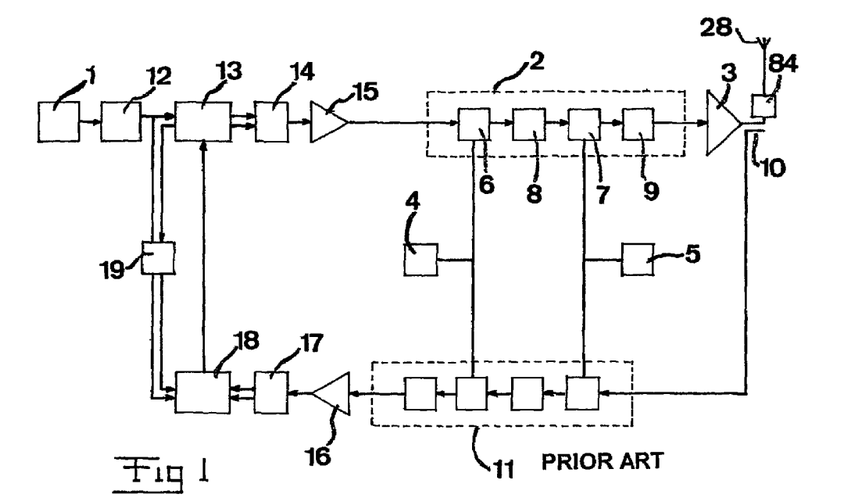
FIG. 1 is a simplified block diagram of a transmitter according to the prior art.

A problem with a transmitter of the type illustrated in FIG. 1 is that the transmission signal down-conversion path is unnecessarily complex and contains a lot of components in the signal path. This leads to linear as well as non-linear distortion of the signal, distorting the feedback-signal so created at the output of the frequency down-conversion device. This makes it troublesome to achieve an accurate copy of the signal at the output of the power amplifier for said comparison reducing the accuracy thereof and thereby the success of the performance-enhancing adjustments of the transmission signal.

U.S. Pat. No. 4,700,151 describes a modulation system capable of improving a transmission system, in which a feedback signal is created through frequency down-conversion of an output signal from a power amplifier for predistortion of a communication signal in the communication signal path for compensating for non-linearities of the amplified output signal. This transmitter uses the same local oscillator for the up- and down-conversion. However, this transmitter only uses one mixing stage.

Furthermore, U.S. Pat. No. 5,974,302 discloses a transceiver, in which the receiver and the transmitter uses the same local oscillators, and the receiver as well as the transmitter thereof have more than one frequency conversion stage. U.S. Pat. No. 5,937,011 describes a transceiver including dual stage up- and down-conversion and common local oscillators as defined in the preamble of appended claim 1.

SUMMARY OF THE INVENTION

The object of the present invention is to provide a transmitter and a method for signal processing in a transmitter being improved with respect to the prior art solution discussed above.

This object is according to one aspect of the invention obtained by providing such a transmitter in which the frequency down-conversion device comprises a local oscillator combiner having means for mixing frequency signals of at least two of said local oscillators for combining them into a combined local oscillator frequency signal, said local oscillator combiner being adapted to send this combined frequency signal to the frequency mixer of the frequency down-conversion device for frequency down-conversion of the transmission signal reducing the number of frequency conversion stages in the transmission signal path of the frequency down-conversion device with respect to the number of frequency conversion stages in the communication signal path of the frequency up-conversion device. A reduced number of frequency down-conversion stages may be used in the frequency down-conversion device with respect to the frequency up-conversion device because the transmission signal at the output of the power amplifier does not contain any strong interferers that need to be filtered away, but only the signal to transmit. This lack of strong interferer means that there is no need for sharp channel select filters for removing strong interferer signals. (Of course a block 84 as described above may still be needed, for instance for protecting the integrity of the feedback down-conversion signal from external signals picked up by an antenna connected to the power amplifier). This results in fewer components in the transmission signal path of the frequency down-conversion device and hence lower linear and non-linear distortion of the feedback signal. A consequence of this will be a more accurate feedback signal for said comparison. Accordingly, the filtering requirements are reduced in said feedback transmission signal path. The number of frequency mixers is not reduced, but components are moved away from the feedback transmission signal path making this less corruptive.

According to a very preferred embodiment of the invention said frequency up-conversion device has two frequency conversion stages and the frequency down-conversion device has one single frequency conversion stage in the transmission signal path, and according to yet another preferred embodiment of the invention defined in claim 3 a transmitter having three frequency conversion stages in the frequency up-conversion device and only one frequency conversion stage in the frequency down-conversion device is provided. Using one single frequency conversion stage in the transmission signal path reduces the number of components therein and linear and non-linear distortions of the output signal from the frequency down-conversion device to a minimum.

According to another preferred embodiment of the invention the transmitter comprises delay means adapted to delay a frequency signal emitted by at least one of said local oscillators on the path to said frequency down-conversion stage of the frequency down-conversion device for substantially matching the delay of this frequency signal from said local oscillator to this stage through said local oscillator combiner with a delay of this signal to this stage through the frequency up-conversion device and the power amplifier and coupler. Such a delay matching will remarkably reduce the phase noise contributions of the local oscillators to the output signal of the frequency down-conversion device. This results in a more accurate feedback signal and/or a faster obtaining thereof, since such phase noise contributions have otherwise to be removed through, for example, a time consuming formation of mean values.

According to another preferred embodiment of the invention the transmitter comprises means for predistortion of said communication signal on the basis of said signal parameter adaptation for cancelling out distortions thereof generated in the path of the communication signal, such as in the power amplifier, for obtaining a substantially distortion-free transmission signal. Said predistortion is preferably, but not necessarily, carried out in the digital domain. Such predistortion may be carried out with a high accuracy, since the low number of parts in the transmission down-conversion signal path will result in a low linear and non-linear distortion of the feedback signal used to correct for linear and non-linear distortions in the communication signal path.

According to another preferred embodiment of the invention the transmitter comprises at least two communication signal branches having a said frequency up-conversion device each or in common, a power amplifier each or in common and a said means for extracting the transmission signal, and said means for signal parameter adaptation is adapted to adjust the gain and/or phase of said transmission signal from the respective branch on the basis of a comparison of a communication signal corresponding to a wanted transmission signal and said feedback signal of each branch or a comparison of feedback signals from all branches. A transmitter in the form of such a transmitter configuration will be especially advantageous for use in a transmitter comprising an adaptive antenna, and in which each branch then will have an antenna for transmitting the transmission signal from the power amplifier. A simplified and advantageous design of such a transmitter has only one said frequency down-conversion device and comprises switching means adapted to alternatingly connect said frequency down-conversion device to different branches for signal parameter adaptation of the communication signals thereof. This keeps the costs for components in the frequency down-conversion part of the transmitter down.

The invention also relates to a radio base station, a communication device for communication with a radio base station, a wireless Local Area Network, wireline transmitters, e.g. ADSL (Asymmetric Digital Subscriber Line) or a future radio base station applications, such as Multiple Input Multiple Output Antenna systems, including a transmitter according to the present invention.

The invention also comprises a method for signal processing in a transmitter having the features listed in the appended claim 22. Merits of this method and preferred embodiments thereof defined in the dependent method claims appear clearly from the discussion above of preferred embodiments of the transmitter according to the present invention.

The invention also relates to a computer program and a computer readable medium according to claims 39 and 41. It is easily understood that the method defined in the appended set of method claims is very suitable to be carried out through program instructions from a processor that may be influenced by a computer program provided with the program steps in question. This computer program may very well be at least partially provided through a network as the Internet.

Further advantages and advantageous features of the invention appear from the following description and the other dependent claims.

BRIEF DESCRIPTION OF THE DRAWINGS

With reference to the appended drawings, below follows a specific description of preferred embodiments of the invention cited as examples.

In the drawings.

DESCRIPTION OF PREFERRED EMBODIMENTS OF THE INVENTION

Firstly, a part of a transmitter according to the present invention, which is not specific for this invention will be described with reference to the prior art transmitter according to FIG. 1, and this part of the transmitters according to different preferred embodiments of the invention illustrated in FIGS. 2, 4 and 5 has been left out in these Figures. Usual data to be transmitted by the transmitter, for instance emanating from human speech, are provided at 1 and sent on to a base band-processing unit 12. The output therefrom is treated in a data modification unit 13 with the aim to obtain enhanced performance on the transmission signal obtained further downstream at the output of the power amplifier 3. The signal is then sent to a digital quadrature modulator 14 combining the complex base-band signal with a digital quadrature oscillator signal into a digital intermediate frequency signal, which is converted into an analog signal in a digital/analog-converter 15 and sent on to the analog frequency up-conversion device 2.

The output signal from the frequency down-conversion device 11 is converted into the digital domain by an analog/digital converter 16 and then processed in a digital quadrature demodulator 17 for the purpose of being compared with a communication signal corresponding to a wanted transmission signal at the output of the power amplifier 3 in a parameter adaptation means 18 influencing the data modification in the unit 13. The members described in these two paragraphs may be the same in a transmitter according to the invention. The prior art transmitter also has a delay means 19 arranged to match the time delay of the communication signal for said comparison with the feedback signal.

The most important features of a first preferred embodiment of a transmitter according to the present invention will now be described while simultaneously referring to FIG. 2 and FIGS. 3a and 3b. 20 illustrates a frequency up-conversion device functioning in the same way as described above with reference to FIG. 1 including an intermediate frequency mixer 21, a filter and amplifier block 22, a radio frequency mixer 23 and a filter block 24. 25 and 26 stand for local oscillators in the form of an intermediate frequency oscillator and a radio frequency oscillator, respectively. 27 and 28 are the power amplifier and an antenna, respectively. Means for extracting a transmission signal resulting at the output of the power amplifier 27 is indicated at 29.

The frequency down-conversion device of this transmitter comprises a local oscillator combiner 30, having means in the form of a local oscillator frequency mixer 31 for mixing the frequency signals from the two local oscillators 25 and 26 for combining them into a combined local oscillator frequency signal. The local oscillator combiner also comprises two blocks 32, 33 containing amplification means for driving the mixer 31 and possibly filters or circulators. The combiner further comprises a block 34 for filtering and amplifying the combined local oscillator frequency signal to drive a frequency mixer 35 of the frequency down-conversion device for frequency down-conversion of the transmission signal. A filter and amplifier block 36 is indicated at the output of the frequency down-conversion mixer 35.

It is also illustrated how the transmitter may comprise different delay means 37–39 for cancelling phase noise from the local oscillators 25 and 26. More exactly, the phase noise introduced through the local oscillator 25 is cancelled if the delay of a signal from this local oscillator to the frequency down-conversion stage 35 of the frequency down-conversion device through said local oscillator combiner 30, i.e. on the path 40, is matched with the delay of this signal to this stage through the frequency up-conversion device and the power amplifier according to the path 41. The same is valid for the local oscillator 26 and the paths 42 and 43, respectively. Phase noise contributions of the local oscillators 25 and 26 to the feedback signal resulting at 44 may in this way be remarkably reduced. This means a faster signal parameter adaptation, since for example no time consuming mean value formation of the feedback signal emanating from the extracted transmission signal will be needed for cancelling phase noises out. However, one or more of the delay means 37–39 may be left out should the local oscillators have sufficient noise performance. It may also be possible to leave out a delay means because the difference in delay between two signal paths is small enough. This may for instance be the case for the local oscillator 26 and the paths 42 and 43.

The function of the part of the transmitter illustrated in FIG. 2 with respect to the frequency mixing will be as follows: A communication signal including user data having a local oscillator communication frequency $LO_{COM}$ arrives to the intermediate frequency mixer 21 from the digital/analog-converter 15 and is there mixed with an intermediate frequency signal from the local oscillator 25 having a local oscillator intermediate frequency $LO_{IF}$ resulting in a lower sideband L and an upper sideband U having a frequency of $LO_{IF}-LO_{COM}$ and $LO_{IF}+LO_{COM}$, respectively, as illustrated in FIG. 3a. It is schematically illustrated through a dashed line w how a filter function is applied on the signal from the mixer 21 in the filter 22 for filtering out the upper sideband U sent further to the radio frequency mixer 23, but it is pointed out that any of the two sidebands may be selected and sent on to the mixer 23, where it is mixed with a radio frequency signal from the local oscillator 26 having a local oscillator radio frequency $LO_{RF}$, which results in a signal having a lower sideband L and an upper sideband U, respectively. The lower sideband will have a frequency of $LO_{RF}-LO_{IF}+LO_{COM}$ or $LO_{RF}-LO_{IF}-LO_{COM}$ depending upon whether the lower or upper sideband had been filtered out in the filter 22. The upper sideband will have a frequency of $LO_{RF}+LO_{IF}-LO_{COM}$ or $LO_{RF}+LO_{IF}+LO_{COM}$ depending upon whether the lower or upper sideband has been filtered out in the filter 22. One of these sidebands are here filtered out through the filter 24 and amplified through the amplifier 27, so that the transmission signal being frequency modulated to one of said four frequencies is transmitted by the antenna 28.

In a corresponding way frequency signals from the two local oscillators 25 and 26 having a frequency of $LO_{IF}$ and $LO_{RF}$, respectively, are mixed in the frequency mixer 31, and a lower sideband having a frequency of $LO_{RF}-LO_{IF}$ and an upper sideband having a frequency of $LO_{RF}+LO_{IF}$ are formed. One of these frequencies is filtered out in the block 34. This combined local oscillator frequency signal is mixed in the frequency mixer 35 with the extracted transmission signal so that a lower sideband L having a frequency of $LO_{COM}$ is achieved as schematically illustrated in FIG. 3B. More exactly, the upper sideband $LO_{RF}+LO_{IF}$ resulting from the combined local oscillator frequency signal is applied if $LO_{RF}+LO_{IF}+LO_{COM}$ or $LO_{RF}+LO_{IF}-LO_{COM}$ has been selected by the filters 22 and 24 as the transmission signal frequency and $LO_{RF}-LO_{IF}$ is applied if any of the two other possible frequencies of the transmission signal referred to above have been filtered out by the filters 22 and 24. As a non-limitative example it may be mentioned that $LO_{COM}$ may be 12.5 MHz, $LO_{IF}$ 128 MHz and $LO_{RF}$ 1992 MHz. If then the upper sideband will be filtered out by the filter 22 this will have a frequency of 140.5 MHz, and if the upper sideband again filtered out through the filter 24, this will have a frequency of 2132.5 MHz. If the extracted transmission signal for this frequency then is mixed with the upper sideband resulting in the frequency mixer 31 having a frequency of 2120 MHz the lower sideband so obtained will have a frequency of 12.5 MHz.

It is pointed out that the frequency values just mentioned are only examples of typical frequencies used for frequency modulation in radio base stations, and any other frequencies may be envisaged. A filter window function w is then applied on this signal through the filter 36 for filtering out said lower sideband L and convey the feedback signal so created to the analog/digital-converter 16 for use in the comparison for signal parameter adaptation in 18. As stated above, it is possible to use a single frequency conversion stage in the path of the extracted transmission signal in the feedback loop because the signal on the output of the power amplifier 27 does not contain any interferers that need to be filtered away, but only the signal to be transmitted. The lack of a strong interferer means in the practice that there is no need for sharp channel select filters for removing strong interferer signals. This leads to fewer and cheaper parts in the signal path and also to lower linear and non-linear distortion of the feedback signal so created. It is noticed that the number of frequency mixing stages and filters in the frequency down-conversion device is not reduced with respect to the prior art transmitter shown in FIG. 1, but a part of them is removed from the path of the extracted transmission signal, so that it will be fewer components corrupting the feedback signal in this path increasing the accuracy of this signal and of the signal parameter adaptation.

Figure 2:
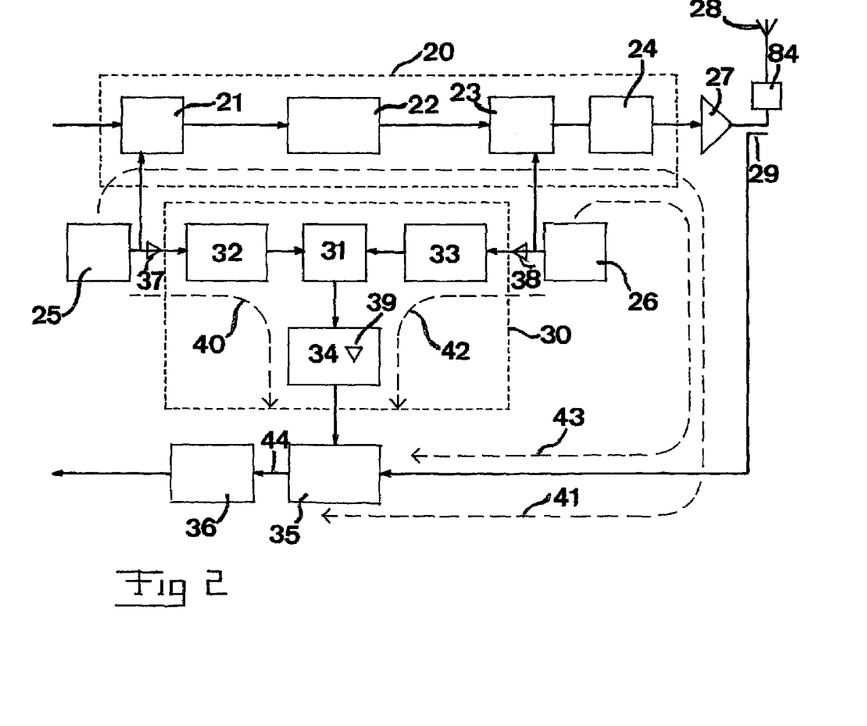
FIG. 2 is a block diagram of the frequency up- and down-conversion part of a transmitter according to a first preferred embodiment of the invention.
Figure 3A:
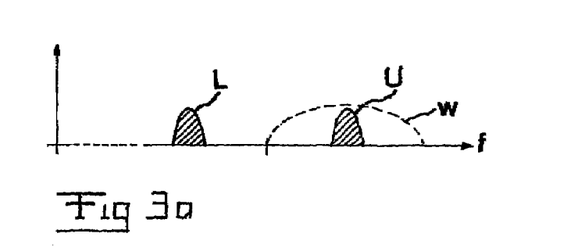
FIGS. 3a and 3b are simplified frequency diagrams used to explain the function of different frequency conversion stages in a transmitter according to the invention.
Figure 3B:
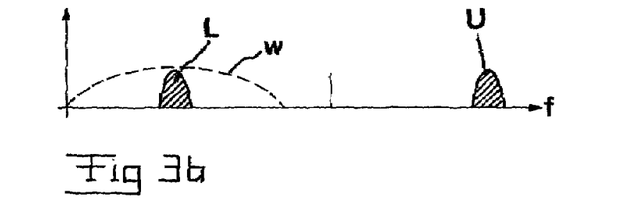
Figure 4:
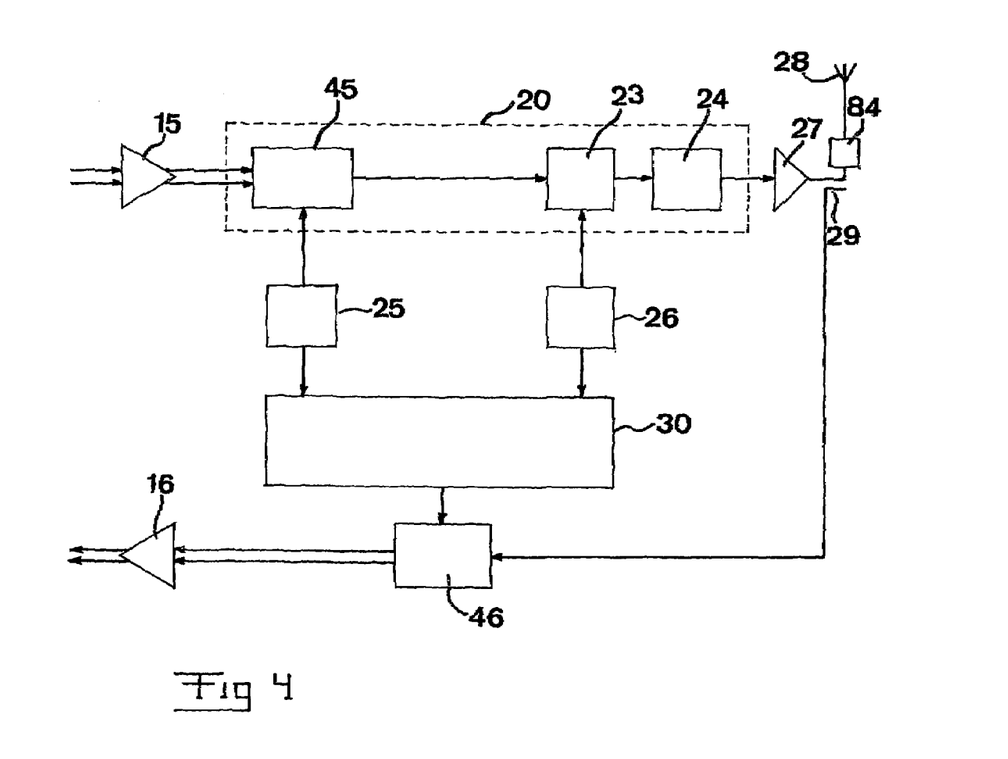
FIG. 4 is a block diagram corresponding to FIG. 2 of a transmitter according to a second preferred embodiment of the invention.

A transmitter according to a second preferred embodiment of the invention being slightly modified with respect to the transmitter illustrated in FIG. 2 is schematically shown in FIG. 4. Parts corresponding to parts of the embodiment according to FIG. 2 are provided with the same reference numerals. It is illustrated how the frequency mixer 21 is replaced by an analog quadrature modulator 45 containing two frequency mixers and making the filter 22 simpler. However, an amplifier and filters may of course be arranged between the quadrature modulator 45 and the frequency mixer 23, although omitted in the Figure. The frequency down-conversion stage is here carried out resulting in base-band I and Q feedback signals at the output thereof. As an alternative an SSB (Single Side Band) mixer may be used instead of the quadrature modulator and/or the quadrature demodulator.

Figure 5:
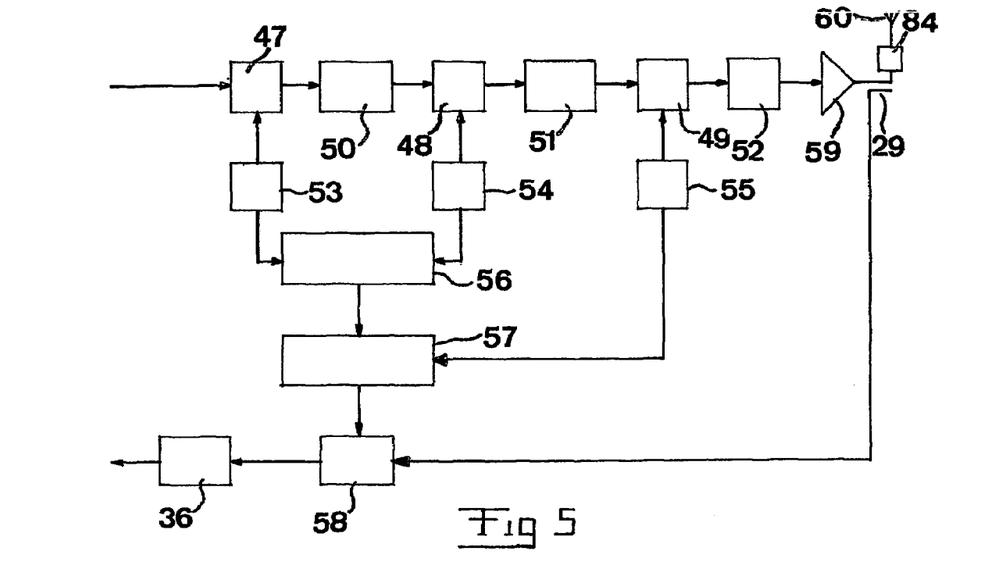
FIG. 5 is a block diagram corresponding to FIG. 2 of a transmitter according to a third preferred embodiment of the invention.

FIG. 5 illustrate a transmitter according to a third preferred embodiment of the invention having three frequency up-conversion stages and one single frequency down-conversion stage in the path of the extracted transmission signal. 47–49 correspond to frequency mixers, 50–52 correspond to filter and amplifier blocks and 53–55 correspond to local oscillators. It is illustrated how the frequency signals from the local oscillators 53 and 54 are combined in a local oscillator combiner 56 for creating a first combined local oscillator frequency signal, which is then mixed with the frequency signal from the local oscillator 55 in a second local oscillator combiner 57 for forming a second combined local oscillator frequency signal to be mixed with the extracted transmission signal in the down-conversion mixer 58. 59 and 60 are the power amplifier and the antenna, respectively. Although this embodiment may in some applications be preferable, it is pointed out that in general the present invention will loose in interest with an increase of the number of the local oscillators used, since the local oscillator combiner configuration will grow in complexity. It is within the scope of the present invention to reduce the number of frequency conversion stages in the path of the extracted transmission signal with respect to the frequency conversion stages in the frequency up-conversion device arbitrarily, so that in the case of three local oscillators as in FIG. 5 the number of frequency down-conversion stages in the path of the extracted transmission signal may be reduced to two, but that would introduce more linear and non-linear distortion to the feedback signal.

Figure 6:
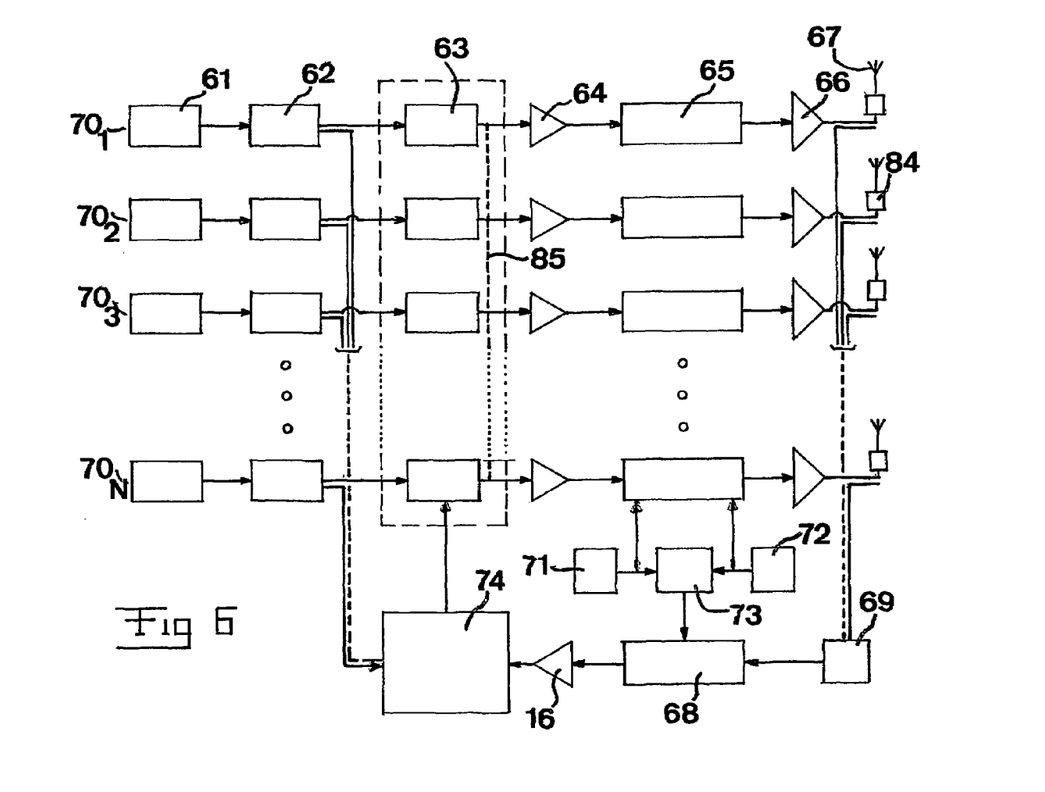
FIG. 6 is a simplified block diagram substantially corresponding to FIG. 1 of a transmitter in the form of a transmitter configuration according to a fourth preferred embodiment of the invention.

FIG. 6 illustrates a transmitter in the form of a transmitter configuration according to a fourth preferred embodiment of the invention in an Adaptive Antenna application. Adaptive or smart antennas are used for transmitting signals in different directions by modifying the amplitude and/or phase in each branch and/or communication signals. It is then important that the requirements of gain and phase accuracy of the transmission signals are met, which may be achieved by using a feedback signal as described above. In a radio base stations the required gain and phase accuracy may typically be 0.2 dB and 1°, respectively.

This transmitter comprises a number of communication signal branches with a signal source 61, base band processing unit 62, data modification unit 63, digital/analog-converter 64, frequency up-conversion device 65, power amplifier 66 and antenna 67. In this case of separate sources 61 for each branch the data modification unit 63 is a matrix, that is every input is able to map to every output as illustrated through the dashed line 85. Each branch may have a frequency down-conversion device of the type shown in FIG. 2, but there may also be a frequency down-conversion device 68 in common to all branches as illustrated in FIG. 6. This means that switching means 69 are provided for alternatingly connect the frequency down-conversion device 68 to different antenna branches 70₁–70$_N$ for signal parameter adaptation of the communication signals thereof. All frequency up-conversion devices may share the same local oscillators 71, 72, but it is also possible that they have separate local oscillators requiring switching means adapted to alternatingly connect the local oscillators of different frequency up-conversion devices with the local oscillator combiner 73 of the frequency down-conversion device. What these different alternatives would look like is apparent to a man with skill in this art and they have therefore not been illustrated by drawings for keeping the number of drawings on a reasonable level.

Furthermore, the feedback signal will be compared in a signal parameter adaptation means 74 with a communication signal corresponding to a wanted transmission signal for the respective branch or all feedback signals are compared if only the wanted relative phase and gain of the individual transmission signals are needed. A signal parameter adaptation is then carried out on the basis of this comparison, in the first place for adjusting the gain and phase of the transmission signal from the respective branch, but also for applying predistortion to the respective communication signal for cancelling out distortions thereof generated in the path of the communication signal, such as in the power amplifier 66, for obtaining a substantially distortion-free transmission signal of the respective branch if desired. The adjustments may as an alternative be carried out on the analog side of the communication signal path. Furthermore, shown are separate sources 61, it could possibly be just one source which is eventually split. This splitting junction can be anywhere from the source to the antenna, assuming that the gain and/or phase adjustment means is after the point of splitting but not necessarily directly after the splitting junction. Accordingly, the separate branches may share the same up-conversion device, and this may as an alternative be achieved by a switching means similar to switching means 69.

Figure 7:
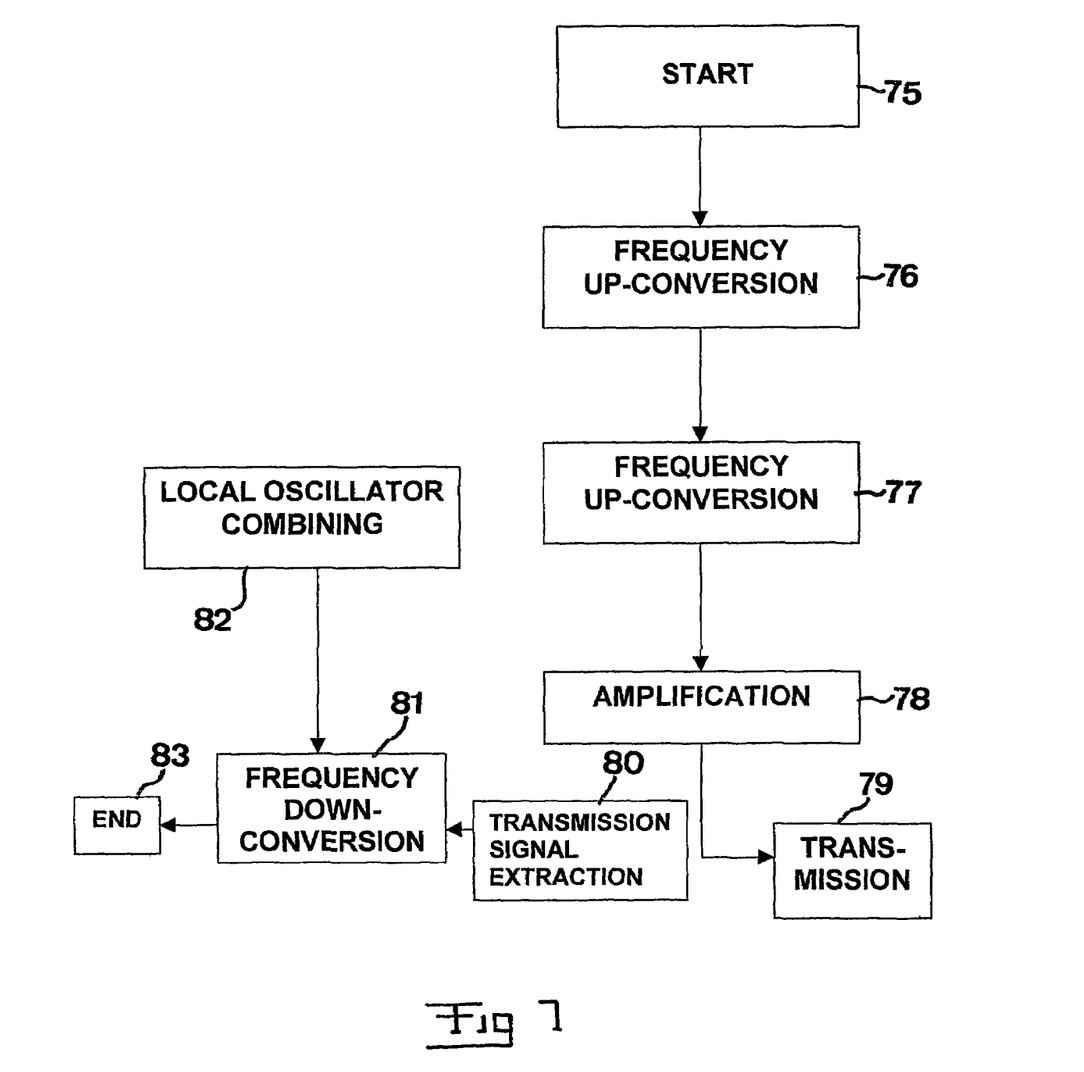
FIG. 7 is a flow chart illustrating a general method for signal processing in a transmitter according to a preferred embodiment of the invention.

FIG. 7 shows a flow chart very schematically illustrating steps in the frequency up- and down-conversion part of a method according to the present invention. It is started with a frequency signal at 75 being twice frequency up-converted 76, 77 and then amplified 78 for being transmitted 79 and extracted 80 to be frequency down-converted 81 after a local oscillator combining 82 in a parallel branch. A feedback signal is then obtained at the end 83.

The invention is of course not in any way restricted to the preferred embodiments described above, but many possibilities to modifications thereof may be envisaged by a man with ordinary skill in the art without departing from the scope of the invention as defined in the appended claims.

It is pointed out that the invention is directed to transmitters having an up-conversion device and a down-conversion device sharing local oscillators, in which local oscillators are combined for reducing the number of conversion stages in the down-conversion device with respect to the number of such stages in the up-conversion device. However, to use separate local oscillators for the up- and down-conversion for having fewer down-conversion stages is not claimed here, although realized by the present inventors.

What is claimed is:

1. A transmitter comprising
   a device for frequency up-conversion of a communication signal to a higher frequency comprising at least two consecutive frequency conversion stages each having a local oscillator and a frequency mixer for mixing the signal of the local oscillator with said communication signal for a stepwise frequency up-conversion of the communication signal,
   a power amplifier for amplifying the output signal from the frequency up-conversion device for obtaining a transmission signal,
   means for extracting the transmission signal,
   a device for frequency down-conversion of said extracted transmission signal to the same frequency as the communication signal before said up-conversion for creating a feedback signal, said frequency down-conversion device being adapted to use the same local oscillators as the frequency up-conversion device for frequency conversion of the transmission signal, and
   means for signal parameter adaptation of the communication signal on basis of said feedback signal for obtaining a desired character of said transmission signal,
   characterized in that said frequency down-conversion device comprises a local oscillator combiner having means for mixing frequency signals of at least two of said local oscillators for combining them into a combined local oscillator frequency signal, and that said local oscillator combiner is adapted to send this combined frequency signal to a frequency mixer of the frequency down-conversion device for frequency down-conversion of the transmission signal reducing the number of frequency conversion stages in the transmission signal path of the frequency down-conversion device with respect to the number of frequency conversion stages in the communication signal path of the frequency up-conversion device.

2. A transmitter according to claim 1, characterized in that said frequency up-conversion device has two frequency conversion stages and the frequency down-conversion device has one single frequency conversion stage in the transmission signal path.

3. A transmitter according to claim 1, characterized in that the frequency up-conversion device has three frequency conversion stages, that the frequency down-conversion device comprises two said local oscillator combiners, namely a first one with means for mixing frequency signals from two of said local oscillators for combining them into a first combined local oscillator frequency signal and a second with means for mixing said first combined local oscillator frequency signal with a frequency signal from a third of said local oscillators for combining them into a second combined local oscillator frequency signal, and that said second local oscillator combiner is adapted to send this second combined local oscillator frequency signal to a frequency mixer of the frequency down-conversion device for frequency down-conversion of the transmission signal reducing the number of frequency conversion stages in the transmission signal path of the frequency down-conversion device to one.

4. A transmitter according to claim 1, characterized in that one of the frequency conversion stages in the frequency up-conversion device is formed by a quadrature modulator and said frequency conversion stage of the frequency down-conversion device for frequency down-conversion of the transmission signal is formed by a quadrature demodulator.

5. A transmitter according to claim 1, characterized in that at least one of the frequency conversion stages in the frequency up-conversion device and/or said frequence conversion stage of the frequency down-conversion device for frequency down-conversion of the transmission signal is formed by a SSB (Single SideBand) mixer.

6. A transmitter according to claim 1, characterized in that it comprises delay means adapted to delay a frequency signal emitted by at least one of said local oscillators on the path to said frequency down-conversion stage of the frequency down-conversion device for substantially matching the delay of this frequency signal from said local oscillator to this stage through said local oscillator combiner with the delay of this signal to this stage through the frequency up-conversion device and the power amplifier.

7. A transmitter according to claim 6, characterized in that it comprises a said delay means for each of said local oscillators.

8. A transmitter according to claim 6, characterized in that it comprises a said delay means connected between the frequency mixing means of said local oscillator combiner and said transmission signal frequency down-conversion stage of the frequency down-conversion device.

9. A transmitter according to claim 6, characterized in that it comprises at least one said delay means arranged to delay a frequency signal sent from one of said local oscillators to said local oscillator combiner.

10. A transmitter according to claim 1, characterized in that it comprises means for predistortion of said communication signal on the basis of said signal parameter adaptation for cancelling out distortions thereof generated in the path of the communication signal, such as in the power amplifier, for obtaining a substantially distortion-free transmission signal.

11. A transmitter according to claim 10, characterized in that it comprises an analog/digital-converter adapted to convert the transmission signal into a digital signal, and that said predistortion means is adapted to carry out said predistortion of the communication signal in the digital domain.

12. A transmitter according to claim 1, characterized in that it comprises at least two communication signal branches having a said frequency up-conversion device each or in common, a power amplifier each or in common and a said means for extracting the transmission signal, and that said means for signal parameter adaptation is adapted to adjust the gain and/or phase of said transmission signal of the respective branch on the basis of a comparison of a communication signal corresponding to a wanted transmission signal and said feedback signal of each branch or a comparison of feedback signals from all branches.

13. A transmitter according to claim 12, characterized in that it comprises a separate said frequency down-conversion device for each of said branches.

14. A transmitter according to claim 13, characterized in that all said frequency up- and down-conversion devices share the same local oscillators.

15. A transmitter according to claim 12, characterized in that it has only one said frequency down-conversion device, and that it further comprises switching means adapted to alternatingly connect said frequency down-converasion device to different branches for signal parameter adaptation of the communication signals thereof.

16. A transmitter according to claim 15, characterized in that it comprises a separate frequency up-conversion device for each branch and all frequency up-conversion devices have separate local oscillators, and that the transmitter comprises switching means adapted to alternatingly connect the local oscillators of different frequency up-conversion devices with the local oscillator combiner of the frequency down-conversion device.

17. A transmitter according to claim 12, characterized in that it comprises an adaptive antenna, and that each branch has an antenna for transmitting the transmission signal from the power amplifier.

18. A radio base station including a transmitter according to claim 1.

19. A communication device, such as a telephone, for communication with a radio base station and including a transmitter according to claim 1.

20. A wireless Local Area Network including a transmitter according to claim 1.

21. A wireline network, such as an ADSL netowrk or a Multiple Input Multiple Output Antenna system, including a transmitter according to claim 1.

22. A method for signal processing in a transmitter comprising the following steps:
 a) frequency up-conversion of a communication signal to a higher frequency by consecutively mixing the communication signal with a signal from at least two consecutive local oscillators for a stepwise frequency up-conversion of the communication signal,
 b) amplifying the output signal resulting from the frequency up-conversion for obtaining a transmission signal,
 c) extracting the transmission signal,
 d) frequency down-conversion of said extracted transmission signal to the same frequency as the communication signal before said up-conversion for creating a feedback signal by using the same local oscillators as for the frequency up-conversion for frequency down-conversion of the transmission signal, and
 e) adapting signal parameters of the communication signal on basis of said feedback signal for obtaining a desired character of said transmission signal,
 characterized in that in step d) frequency signals of at least two of said local oscillators are mixed for combining them into a combined local oscillator frequency signal, which is then used in said frequency down-conversion stage for frequency down-conversion of the transmission signal, thus reducing the number of frequency conversion stages in the transmission signal path of the frequency down-conversion with respect to the number of frequency conversion stages in the communication signal path of the frequency up-conversion.

23. A method according to claim 22, characterized in that the frequency up-conversion in step a) is carried out by mixing the communication signal in two frequency conversion stages with frequency signals from two said local oscillators and in step d) the transmission signal is only subjected to a frequency down-conversion once.

24. A method according to claim 22, characterized in that in step a) said communication signal is subjected to three frequency up-conversions, that in step d) firstly frequency signals from two of said local oscillators are mixed for combining them into a first combined local oscillator frequency signal and then this signal is mixed with the frequency signal from a third of said local oscillators for combining them into a second combined local oscillator frequency signal, which is subsequently mixed with the transmission signal for frequency down-conversion thereof thus reducing the number of frequency conversion stages in the transmission signal path for said frequency down-conversion to one.

25. A method according to claim 22, characterized in that in step a) the communication signal is firstly mixed with a local oscillator frequency signal in a quadrature modulator and in step d) the transmission signal is frequency down-converted by being mixed with a combined local oscillator frequency signal in a quadrature demodulator.

26. A method according to claim 22, characterized in that in step a) the communication signal is firstly mixed with a local oscillator frequency signal in an SSB (Single Side-Band) mixer and in step d) the transmission signal is frequency down-converted by being mixed with a combined local oscillator frequency signal in an SSB mixer.

27. A method according to, characterized in that a frequency signal emitted by at least one of said local oscillators is delayed on the path to said frequency down-conversion stage so as to substantially match the delay of this frequency signal from said local oscillator to this stage through the local oscillator signal combining step with the delay of this signal to this stage through the frequency up-conversion step a) and the power amplifying step b).

28. A method according to claim 27, characterized in that the frequency signals sent from each local oscillator for local oscillator frequency signal combining in step d) are delayed.

29. A method according to claim 27, characterized in that the combined local oscillator frequency signal produced in step d) is delayed for obtaining said matching.

30. A method according to any of claim 27, characterized in that frequency signal sent from at least one of said local oscillators is delayed before being combined with a frequency signal from another local oscillator for producing a combined local oscillator frequency signal in step d) for obtaining said delay matching.

31. A method according to any of claim 22, characterized in that said communication signal is predistorted for cancelling out distortions thereof generated in the path of the communication signal, such as in a power amplifier, for obtaining a substantially distortion-free transmission signal and this is done in step e).

32. A method according to claim 31, characterized in that said transmission signal is after said frequency down-conversion thereof analog/digital-converted and said predistortion of the communication signal is carried out in the digital domain.

33. A method according to claim 22, characterized in that it is carried out on a transmitter comprising at least two communication signal branches for each of which steps a), b) and c) are carried out, and that steps d) and e) are carried out for each branch for adjusting the gain and/or phase of the transmission signal from the respective branch on the basis of a comparison of a communication signal corresponding to a wanted transmission signal and said feedback signal of each branch or a comparison of feedback signals from all branches.

34. A method according to claim 33, characterized in that a separate frequency down-conversion is carried out for each of said branches.

35. A method according to claim 34, characterized in that the same local oscillators are used for all the branches for said frequency up- and down-conversion.

36. A method according to claim 35, characterized in that each branch has a separate frequency up-conversion stage and all frequency up-conversion stages have separate local oscillators, and that the local oscillators of different frequency up-conversion stages are alternatingly connected to the local oscillator combining in step d) of the frequency down-conversion stage.

37. A method according to claim 33, characterized in that said transmitter has only one frequency down-conversion stage in common to all said branches, and that said frequency down-conversion stage is alternatingly connected to different branches for signal parameter adaptation of the communication signals thereof.

38. A method according to any of claim 33, characterized in that the transmitter comprises an adaptive antenna and each branch has an antenna for transmitting the respective amplified transmission signal.

39. A computer program directly loadable into the internal memory of a computer, comprising software for controlling the steps of claim 22 when said program is run on the computer.

40. A computer program according to claim 39, provided at least partially through a network as the internet.

41. A computer readable medium, having a program recorded thereon, where the program is to make a computer control the steps of claim 22.

* * * * *